United States Patent
Frindt et al.

(10) Patent No.: US 7,913,380 B2
(45) Date of Patent: Mar. 29, 2011

(54) WAFER TABLE PREPARING ELECTRICAL COMPONENTS AND DEVICE FOR EQUIPPING SUBSTRATES WITH THE COMPONENTS

(75) Inventors: Matthias Frindt, Bad Tölz (DE); Mohammad Mehdianpour, München (DE); Harald Stanzl, München (DE)

(73) Assignee: ASM Assembly Systems GmbH & Co. KG, Munich (DE)

( * ) Notice: Subject to any disclaimer, the term of this patent is extended or adjusted under 35 U.S.C. 154(b) by 534 days.

(21) Appl. No.: 11/662,038

(22) PCT Filed: Jan. 5, 2006

(86) PCT No.: PCT/EP2006/050058
§ 371 (c)(1),
(2), (4) Date: Nov. 13, 2007

(87) PCT Pub. No.: WO2006/079577
PCT Pub. Date: Aug. 3, 2006

(65) Prior Publication Data
US 2008/0089762 A1    Apr. 17, 2008

(30) Foreign Application Priority Data
Jan. 25, 2005  (DE) .......................... 10 2005 003 454

(51) Int. Cl.
*B23P 19/00* (2006.01)
(52) U.S. Cl. ................ 29/760; 29/721; 29/740; 29/741; 29/759; 29/809

(58) Field of Classification Search .................... 29/760, 29/721, 740, 741, 743, 759, 809, 832, 833, 29/DIG. 44; 414/222.02, 737, 744.7, 936
See application file for complete search history.

(56) References Cited

U.S. PATENT DOCUMENTS

| 5,839,187 A | 11/1998 | Sato et al. | |
|---|---|---|---|
| 6,543,513 B1 * | 4/2003 | Lau et al. | ....................... 156/540 |
| 6,839,959 B1 * | 1/2005 | Hosotani et al. | ................ 29/740 |

FOREIGN PATENT DOCUMENTS

| EP | 0 971 390 A | 1/2000 |
|---|---|---|
| EP | 1 120 827 A1 | 8/2001 |
| JP | 60 207349 A | 10/1985 |
| JP | 02 056946 A | 2/1990 |
| JP | 6169002(A) | 6/1994 |
| JP | 07 221164 A | 8/1995 |
| JP | 2002111289(A) | 4/2002 |
| JP | 2003318225(A) | 11/2003 |
| JP | 2004 103923 A | 4/2004 |

* cited by examiner

*Primary Examiner* — Thiem Phan
(74) *Attorney, Agent, or Firm* — Harness, Dickey & Pierce, P.L.C.

(57) ABSTRACT

A wafer table for providing electrical components of a wafer includes a rotary disk to receive a wafer. The rotary disk is configured to be displaced parallel to a wafer plane in discrete steps such that the components arrive at a stationary pick-up position. A stationary auxiliary facility is assigned to the pick-up position, and a first rotary drive rotates the rotary disk. A carriage supports the rotary disk and is displaced in a stationary linear guide parallel to the wafer by means of a linear drive. The first rotary drive and the linear drive are positioned such that each of the components arrives at the pick-up position.

10 Claims, 1 Drawing Sheet

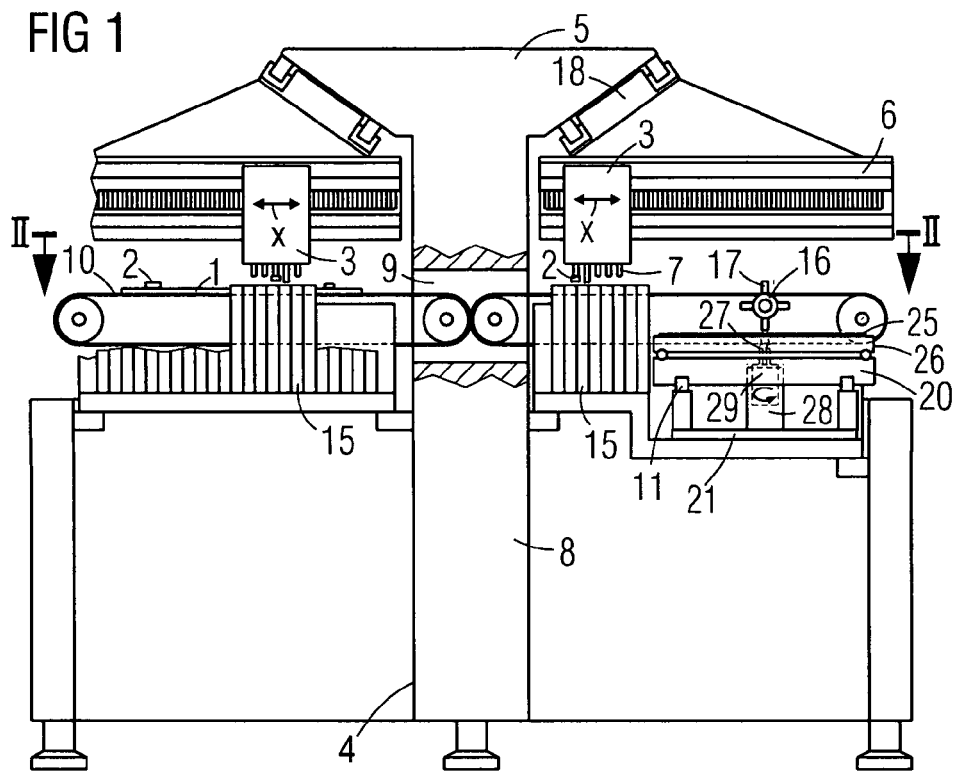
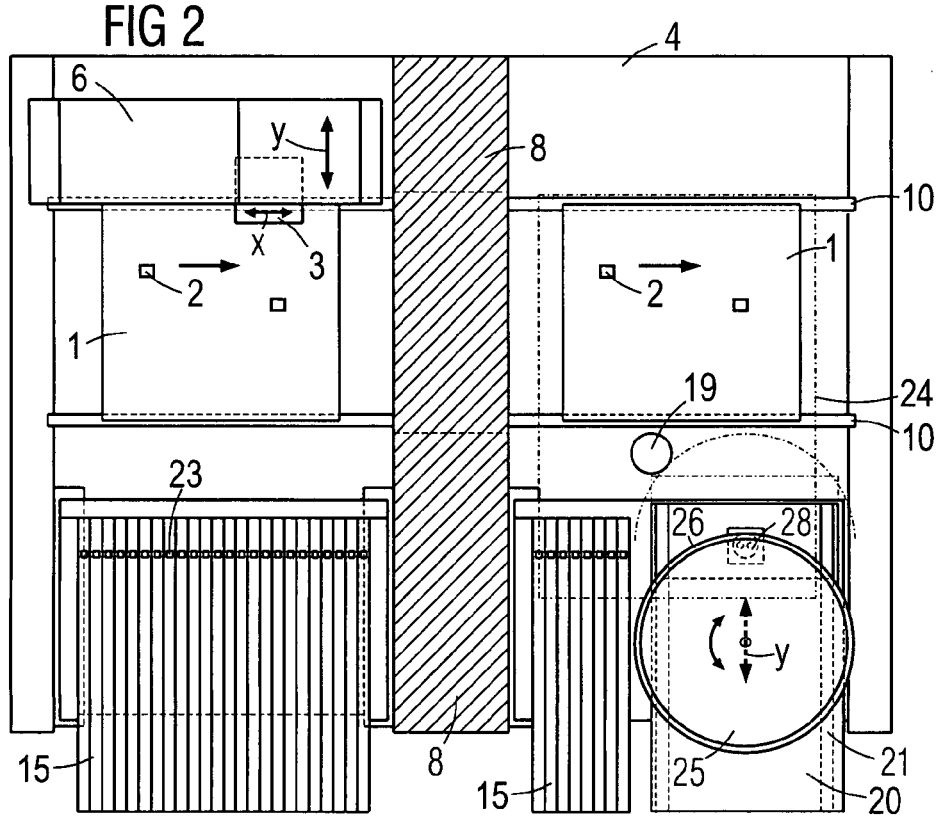

WAFER TABLE PREPARING ELECTRICAL COMPONENTS AND DEVICE FOR EQUIPPING SUBSTRATES WITH THE COMPONENTS

BACKGROUND OF THE INVENTION

The invention relates to a wafer table for preparing electrical components of a wafer, which can be placed on a rotary disk of the wafer table, with the rotary disk being able to be finely displaced parallel to the wafer plane in discrete steps, such that the components arrive at a stationary pick-up position, to which at least one stationary auxiliary facility is assigned.

A wafer table of this type is known from EP 0971390 A for instance. According to this, an assembly head can be moved in a linear fashion parallel to a substrate between two fixed locations, said substrate being guided on a clocked tape transport. Next to the conveyor belt is the wafer table having an x-y-displaceable cross carriage, on which wafer table components are prepared in a wafer parallel to the substrate. One component can thereby be captured in each instance at the stationary pick-up position by the assembly head, moved by way of the laterally displaceable substrate and placed hereupon. As the wafer table only features a restricted x-y displacement section, it is not possible to bring all components of the wafer to the pick-up location of the assembly head. The wafer rests on a rotary disk of the cross carriage and can be rotated through 90° or 180°, in order also to pick up the remaining components.

SUMMARY OF THE INVENTION

The object underlying the invention is to create a simpler wafer table with a reduced installation width.

On aspect involves a wafer table for providing electrical components of a wafer. The wafer table includes a rotary disk to receive a wafer and is configured to be displaced parallel to a wafer plane in discrete steps such that the components arrive at a stationary pick-up position. A stationary auxiliary facility is assigned to the pick-up position, and a first rotary drive rotates the rotary disk. A carriage supports the rotary disk and is displaced in a stationary linear guide parallel to the wafer by means of a linear drive. The first rotary drive and the linear drive are positioned such that each of the components arrives at the pick-up position.

The rotary drive supersedes one of the x-y linear axes of the cross carriage, with a simple rotary bearing and rotary drive instead of a linear guide and linear drive. Only one stationary linear guide remains for the carriage. Such a simple guide provides for greater positioning accuracy than a more complex cross guide with overlapping movements. The rotary movement does not require any additional movement space. The rotary disk is only moved in a linear fashion. The wafer table can thus be designed with a smaller installation width, thereby increasing its possibilities for use when equipping printed circuit boards for instance. The rotation of the wafer does change the angular position of the respective component. This can be corrected in that a subsequent gripper tool, e.g. of an assembly head, carries out a corresponding counter rotation.

In one embodiment, the angular position of the distancing needles can be adjusted to that of the component to be picked up in each instance.

The flip facility according to one embodiment allows the component, configured as a flip chip for instance, to be moved into a transfer position, in which it can be taken by an assembly head in an orientation which is appropriate for assembly.

With the assembly device according to one embodiment, the installation width of the wafer table is reduced considerably.

The camera according to one embodiment allows the precise position, particularly the angular position, of the component at the gripper of the assembly head to be determined and correspondingly corrected.

One embodiment enables by means of the narrow construction of the wafer table that additional components from other reserve stores, e.g. from component belts can be prepared by means of belt conveyors.

BRIEF DESCRIPTION OF THE SEVERAL VIEWS OF THE DRAWINGS

The invention is described in further detail below with reference to an exemplary embodiment illustrated in the drawing, in which;

FIG. 1 shows a side view of an assembly device having a wafer table according to the invention FIG. 2 shows a section along the line II-II in FIG. 1

DETAILED DESCRIPTION OF THE INVENTION

FIGS. 1 and 2 show a device for equipping flat substrates 1 with electrical components 2 by means of an assembly head 3 which can be moved in a work plane parallel to the substrate 1. A frame 4 of the device features a stationary carrier 5, to which a positioning arm 6 can be guided in a fashion such that it can be displaced in a second coordinate direction Y and is driven by means of a linear motor. The assembly head 3 is guided in a fashion such that it can be displaced on the longitudinal positioning arm 6 in a first coordinate direction x, which is perpendicular to the second coordinate direction y. The carrier 5 is connected in a fixed fashion over its entire length to a rigid supporting wall 8, which extends in the longitudinal direction and points downwards.

The central region of the supporting wall 8 is provided with a through hole 9, through which a transport section 10 for the substrates 1 is guided in a perpendicular manner. The entire device is designed to be a mirror-symmetrical on both sides of the supporting wall 8, with the carrier 5 projecting on both sides, the positioning arms 6 and the assembly head 3. Accordingly, the substrates 1 can be temporarily fixed on the transport section 10 at assembly sites on both sides of the supporting wall 8, as shown.

Sites for a wafer table 21 as well as for narrow component feeds 15 arranged next to one another are arranged upstream of the assembly sites next to the transport section. These sites comprise a series of pick-up sites 23, at which the components 2 fed from coils for instance can be removed by means of the assembly head 3, which then transports these components 2 to their mounting positions on the substrate 1.

A maximum access range 24 of the assembly head 3 marked by the dashed line covers the assembly region of the substrate 1 and the pick-up region of the components 2 with the pick-up sites 23. The wafer table 21 is arranged directly adjacent to some of the component feeds 15 and is provided with a rotary disk 26, upon which a wafer 25 which is parallel to the substrate is arranged. The rotary disk 26 is provided with a rotary axis which is perpendicular to the wafer 25 and is coupled to a rotary drive (not shown), which enables the rotary disk 26 to be rotated in small angular steps. The rotary disk 26 is supported on a carriage 20 which can be moved in a stationary linear guide 11, said carriage 20 being able to be finely displaced by means of a linear drive (not shown).

The combination of the linear and angular coordinates of the carriage 20 and of the rotary disk 26 enables each of the components 2 to be moved to a stationary pick-up position, which is defined by the position of a stationary ejector 28, which is arranged below the wafer 25. This is provided with distancing needles 27 which can be lifted and point upwards, said distancing needles lifting the components 2 away from a carrier film of the wafer. The distancing needles 27 are supported at a rotor 29 of the ejector 28, the angle of said rotor 29 being able to be finely adjusted, and can thus be rotated into an angular position appropriate for the component 2.

A revolver-type flip facility 16 with suction grippers 17 for the lifted components 2 is located on the wafer table 21 above the ejector 28. The suction grippers 17 are rotated upward and turned with the suctioned components 2 by gradual rotation about a horizontal axis. In this transfer position, the components 2 are captured by the grippers 7 of the assembly head 3. This latter moves over a camera 19 held in the frame, said camera measuring the precise position of the components 2. The grippers 7 can be rotated about their longitudinal axis by means of a second rotary drive and can rotate the suctioned components 2 into the assembly position provided.

The horizontal displacement direction of the carriage 20 is oriented perpendicular to the transport section 10 of the substrate 1. The wafer table 21 thus requires a minimal installation width, thereby allowing sites to be obtained for further feed facilities 15.

REFERENCE CHARACTERS x,y coordinate direction
1 substrate
2 component
3 assembly head
4 frame
5 carrier
6 positioning arm
7 gripper
8 supporting wall
9 through hole
10 transport section
15 component feed
16 flip facility
17 suction gripper
18 linear motor
19 camera
20 carriage
21 wafer table
23 pick-up site
24 access region
25 wafer
26 rotary disk
27 distancing needle
28 ejector
29 rotor

The invention claimed is:

1. A wafer table for providing electrical components of a wafer, comprising:
a rotary disk to receive a wafer, wherein the rotary disk is configured to be displaced parallel to a wafer plane in discrete steps such that the components arrive at a stationary pick-up position;
a stationary auxiliary facility assigned to the pick-up position;
a first rotary drive configured to rotate the rotary disk; and
a carriage mounted on the wafer table and affixed to the rotary disk, the carriage having only one stationary linear guide and being displaceable in the stationary linear guide parallel to the wafer by a linear drive, wherein the first rotary drive and the linear drive are configured to be positioned such that each of the components arrives at the pick-up position.

2. The wafer table of claim 1, wherein the auxiliary facility is an ejector for detaching the components from a carrier film of the wafer and has a rotor with a rotary axis disposed perpendicular to the wafer plane, wherein the rotor comprises at least two distancing needles for the components at a distance from one another, and wherein the rotor is configured to be rotated according to an angular position of the rotary disk.

3. The wafer table of claim 1, further comprising a further auxiliary facility assigned to the pick-up position, wherein the further auxiliary facility is a stationary flip facility for receiving and turning the components.

4. The wafer table of claim 1, wherein the rotary disk is rotated in small angular steps.

5. The wafer table of claim 1, wherein the carriage is only moved linearly.

6. A device for equipping a substrate with electrical components, comprising:
a wafer table for providing electrical components of a wafer, wherein the wafer table includes:
a rotary disk to receive a wafer, the rotary disk being configured to be displaced parallel to a wafer plane in discrete steps such that the components arrive at a stationary pick-up position;
a stationary auxiliary facility assigned to the pick-up position;
a first rotary drive configured to rotate the rotary disk; and
a carriage mounted on the wafer table and affixed the rotary disk. the carriage the carriage having only one stationary linear guide and being displaceable in the stationary linear guide parallel to the wafer by a linear drive, wherein the first rotary drive and the linear drive are configured to be positioned such that each of the components arrives at the pick-up position; and
an assembly head configured to be displaced parallel to a direction of travel of the substrate to transport the substrate in a first coordinate direction, wherein the assembly head includes at least one gripper for handling the components, wherein the gripper is coupled to a second rotary drive, and wherein the carriage is configured to be displaced in a second coordinate direction, which is substantially perpendicular to the first coordinate direction.

7. The device of claim 6, further comprising a camera for determining a position of the component at the gripper.

8. The device of claim 6, further comprising sites for a feed facility in an access region of the assembly head next to the wafer table.

9. The device of claim 6, wherein the rotary disk is rotated in small angular steps.

10. The device of claim 6, wherein the carriage is only moved linearly.

* * * * *